US012289834B2

(12) United States Patent
Pujol et al.

(10) Patent No.: US 12,289,834 B2
(45) Date of Patent: Apr. 29, 2025

(54) FASTENER AND SEALANT

(71) Applicant: Lear Corporation, Southfield, MI (US)

(72) Inventors: Antoni Pujol, Valls (ES); Luis Miguel Munoz Garcia, Valls (ES); Angel Molinero Benitez, Valls (ES); Oscar Cano Salomo, Valls (ES); Ignacio Ferran, Valls (ES)

(73) Assignee: Lear Corporation, Southfield, MI (US)

(*) Notice: Subject to any disclaimer, the term of this patent is extended or adjusted under 35 U.S.C. 154(b) by 161 days.

(21) Appl. No.: 18/148,017

(22) Filed: Dec. 29, 2022

(65) Prior Publication Data
US 2024/0224427 A1   Jul. 4, 2024

(51) Int. Cl.
*H05K 1/18* (2006.01)

(52) U.S. Cl.
CPC ..... *H05K 1/184* (2013.01); *H05K 2201/0999* (2013.01); *H05K 2201/10272* (2013.01); *H05K 2201/10916* (2013.01); *H05K 2201/10984* (2013.01)

(58) Field of Classification Search
CPC ......... H05K 1/184; H05K 2201/10409; H05K 5/0008
See application file for complete search history.

(56) References Cited

U.S. PATENT DOCUMENTS

| 10,700,451 | B1 | 6/2020 | Pinol Pedret et al. |
| 11,211,721 | B2 | 12/2021 | Molinero Benitez et al. |
| 11,339,820 | B2 | 5/2022 | Thomas et al. |
| 2019/0132978 | A1* | 5/2019 | Lim ........................ H05K 5/006 |
| 2021/0355984 | A1* | 11/2021 | Zimmerman .......... F16B 35/048 |
| 2022/0243754 | A1* | 8/2022 | Gallegos ............... F16B 33/004 |

FOREIGN PATENT DOCUMENTS

DE    10243537 A1    3/2004

OTHER PUBLICATIONS

OmniTechnik Mikroverkapselungs GmbH [www.precote.com], precote 85, Product Information, Aug. 2019, 4 pages.

* cited by examiner

*Primary Examiner* — Jeremy C Norris
(74) *Attorney, Agent, or Firm* — Brooks Kushman P.C.

(57) ABSTRACT

A fastener is provided with a pair of terminal ends with an intermediate region therebetween, with at least one of the terminal ends being threaded. The fastener is further provided with a sealant at least partially disposed on the intermediate region.

20 Claims, 3 Drawing Sheets

FASTENER AND SEALANT

TECHNICAL FIELD

Various embodiments relate to threaded fasteners for electrical terminals.

DETAILED DESCRIPTION

Figure 1:
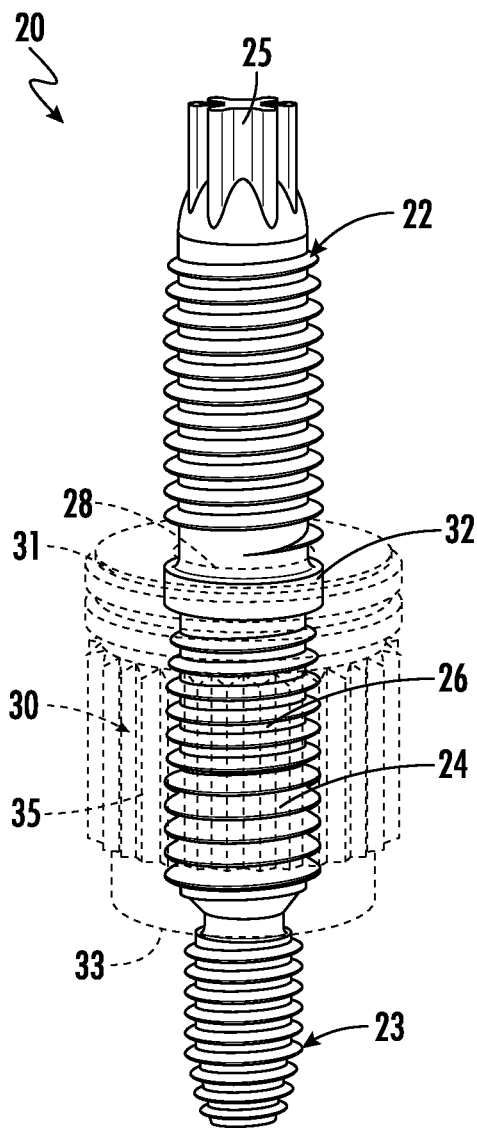
FIG. 1 is a perspective view of a fastener assembly according to an embodiment.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It is to be understood that the disclosed embodiments are merely exemplary and that various and alternative forms are possible. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ embodiments according to the disclosure.

"One or more" includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting." depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 2:
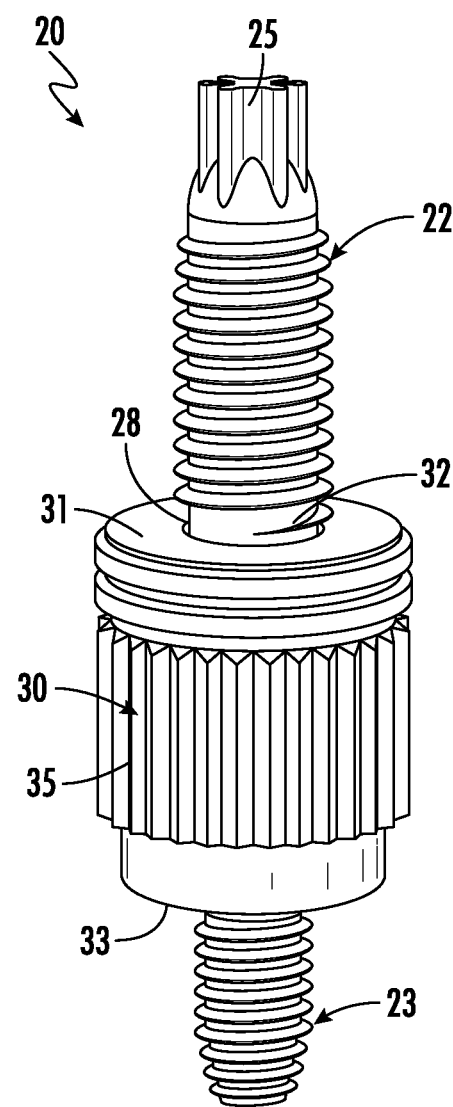
FIG. 2 is another perspective view of the fastener assembly of FIG. 1.
Figure 3:
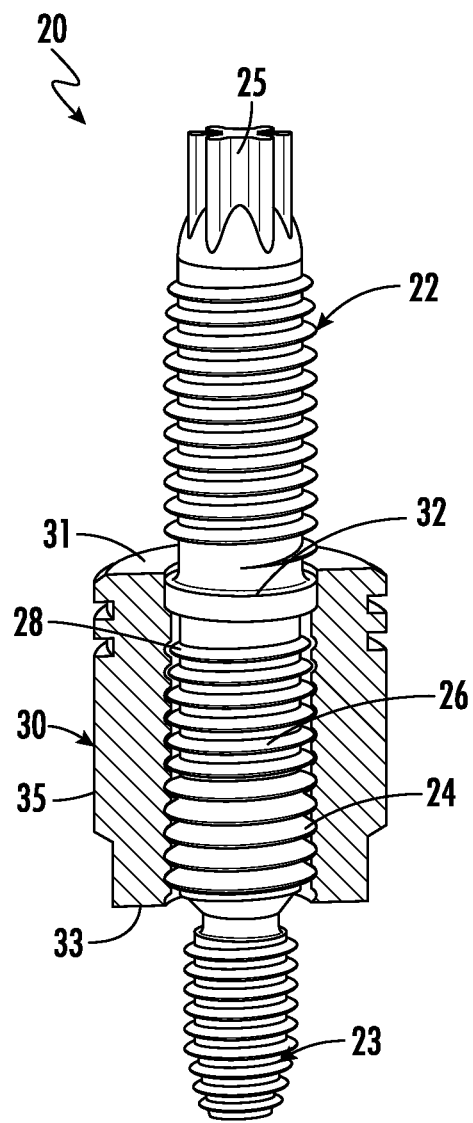
FIG. 3 is a partial section perspective view of the fastener assembly of FIG. 1.

FIGS. 1-3 illustrate a fastener 20 for electric terminals, such as posts for attaching electric terminals to a conductor. The fastener 20 is formed from a steel alloy or any suitable material for attaching another fastener to retain the electric terminal in electrical contact, especially during application of high current or high voltage.

The fastener 20 includes a pair of terminal post ends 22, 23 with an intermediate region 26 therebetween. According to an embodiment, at least one of the post ends 22, 23 of the pair of post ends 22, 23 is a threaded stud. According to the depicted embodiment, both post ends 22, 23 of the pair of post ends 22, 23 are threaded. The fastener 20 includes a tool drive head 25 on at least one end 22 of the pair of post ends 22, 23 to receive a tool to drive the fastener 20. The tool drive head 25 is illustrated as a star drive head 25 to receive a star drive socket for turning and driving the fastener 20. Alternatively, the tool drive head 25 may be a star drive socket, a hex head, a hex socket, a screw slot, or the like.

The intermediate region 26 is threaded for installation of the fastener 20. The intermediate region 26 is also self-tapping for tapping a conductor during installation. The fastener 20 includes a sealant 24 at least partially disposed on the intermediate region 26. The sealant 24 is composed of a synthetic polymer material. One example of a suitable sealant 24 is precote 85 offered by omniTECHNIK Mikroverkapselungs GmbH of Munich, Germany, which is a commercially available acrylate sealant; and the teachings of which are incorporated by reference herein.

With reference to FIGS. 1-3, the fastener 20 is illustrated in cooperation with a conductive body 30. The conductive body 30 is formed from a highly conductive material, such as a copper alloy. The conductive body 30 is provided with an aperture 28 formed therethrough and sized to receive the intermediate region 26. The sealant 24 seals an engagement of the intermediate region 26 in the conductive body 30 without an additional unitary seal. Therefore, the sealant 24 provides a fluid-tight seal between the fastener 20 and the conductive body 30, while eliminating the space, cost and manufacturing required to add an additional unitary seal, such as elastomeric rings, gaskets, or the like. The sealant 24 may also provide a locking seal of the intermediate region 26 of the fastener 20 within the aperture 28 of the conductive body 30.

According to an embodiment, the proximal post end 23 is smaller than the intermediate region 26 to fit through the conductive body aperture 28 and extend beyond the conductive body 30. According to one embodiment, the external thread of the distal post end 22 is oversized relative to the intermediate region 26 to provide a limit to translation of the fastener 20 into the aperture 28 of the conductive body 30.

However, the distal post end 22 may have any suitable thread diameter, which may match the diameter of the intermediate region 26.

The fastener 20 further includes a metal ring 32 disposed about the fastener 20. The metal ring 32 is oversized relative to the intermediate region 26 to provide the limit to translation of the fastener 20 into the aperture 28 of the conductive body 30. The metal ring 32 may be formed unitarily with the fastener 20.

With reference to FIG. 3, a method of installing the fastener 20 into the conductive body 30 is illustrated. The intermediate region 26 is self-tapping. For example, the threads of the intermediate region 26 may be lobular, such as tri-lobular, to impart a cutting effect to tap threads into the aperture 28 during installation. The aperture 28 is undersized relative to the intermediate region 26. The fastener 20 is rotated and translated as the intermediate region 26 engages into the aperture 28 of the conductive body 30. As the intermediate region 26 is translated into the aperture 28, the intermediate region 26 taps threads into the aperture 28 of the conductive body 30, thereby fastening the fastener 20 to the conductive body 30. The sealant 24 may include adhesive particles that break during the tapping operation to glue the body 30 to the stud 20 and to provide a water-tight assembly.

FIGS. 1-3 illustrate that the conductive body 30 is generally cylindrical in the depicted embodiment. The conductive body 30 includes a pair of opposed terminal contact surfaces 31, 33 to attach electrical terminals in electrical contact with the conductive body 30. The conductive body 30 also includes a plurality of external projections, such as a spline 35 for locking the conductive body 30 from rotation within a support.

Figure 4:
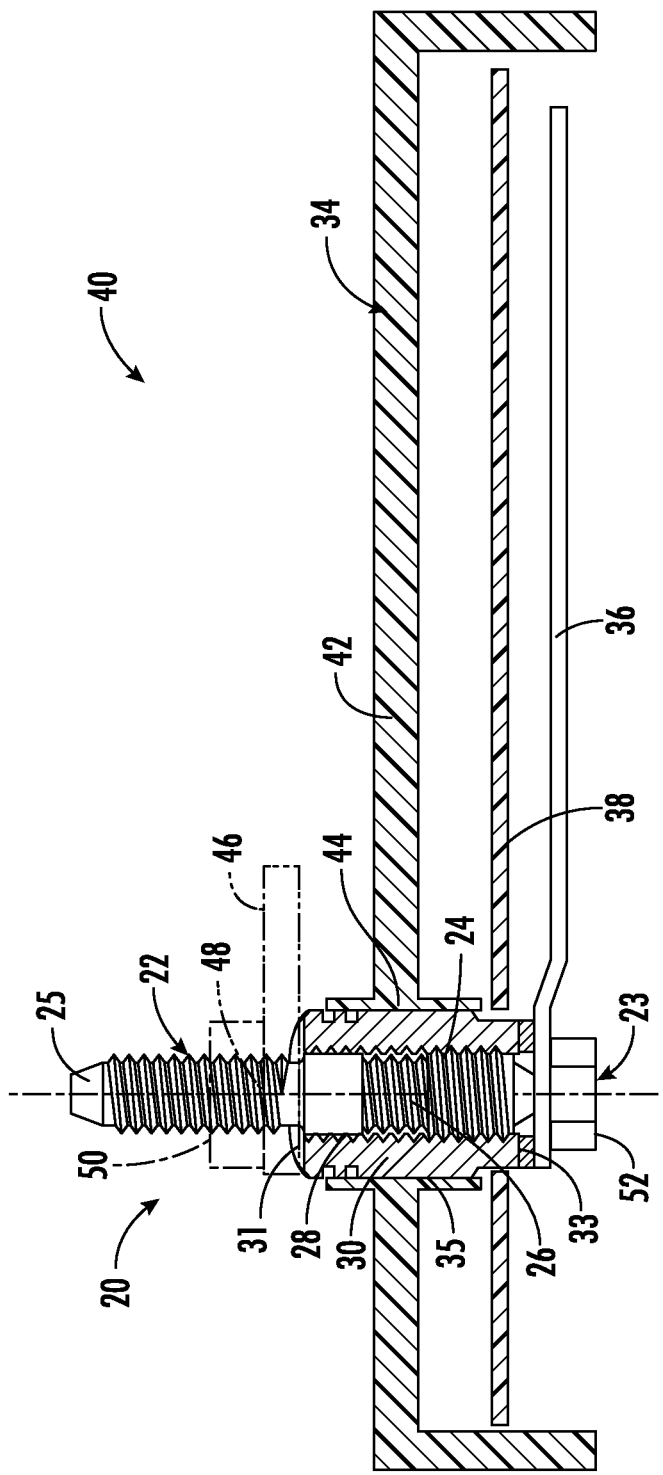
FIG. 4 is a partial section side elevation view of a power transfer unit in cooperation with the fastener assembly of FIG. 1 according to another embodiment.

FIG. 4 illustrates an electrical assembly 40, such as a power transfer unit assembly 40. The assembly 40 includes the fastener 20 installed into a housing 34. The housing 34 may be a polymeric material. The conductive body 30 of the fastener 20 is installed through a wall 42 of the housing 34. The housing 34 is over-molded onto the conductive body 30 according to one embodiment. According to another embodiment, the conductive body 30 is pressed into an undersized aperture 44 in the wall 42 of the housing 34. According to one embodiment, the fastener 20 is preinstalled in the conductive body 30 prior to installation in the housing 34. According to another embodiment, the conductive body 30 is installed in the housing 34, and then the fastener 20 is installed in the conductive body 30. The fastener 20 can be installed from either direction, exterior or interior, of the housing 34.

The distal post end 22 is oriented external of the housing 34. The distal post end 22 permits a terminal plate 46, such as an eyelet with an aperture 48 to be installed on the post end 22. An internally threaded nut 50 is installed on the post end 22 thereby securing the terminal plate 46 in electrical contact with the contact surface 31 on the conduct body 30. The threaded engagement of the nut 50 to the post end 22 provides a secure connection to withstand high power applications.

The proximal post end 23 is oriented internally within the housing 34. The assembly 40 includes a busbar 36 oriented within the housing 34. The busbar 36 is installed on the internal post end 23 in electrical contact with the conductive body 30. An internally threaded nut 52 is installed on the proximal post end 23 to secure the busbar 36 into electrical contact with the contact surface 33 of the conductive body 30. The assembly 40 further includes a power transfer unit circuit board 38 oriented within the housing 34 in electrical communication with the conductive body 30 and/or the busbar 36. The power transfer unit assembly 40 may be a converter, transformer, charger, or the like.

The fastener 20 provides an electrical terminal post 20 with two post ends 22, 23 that is less weight and more compact than prior post assemblies. Likewise, the conductive body 30 is a lighter weight and more compact than prior art conductive bodies. In an automotive application, the reduced weight and compactness adds to vehicle efficiency by reducing fuel or energy required to transport the vehicle. The post 20 also increases energy efficiency by secured electrical contact. The simplified fastener 20 reduces labor time, reduces a quantity of fasteners, eliminates unitary seals, and thereby reduces weight, costs, and manufacturing time.

According to another embodiment, the fastener 20 of FIG. 5 includes an enlarged fastener head 52 formed unitarily with the fastener 20. The fastener head 52 may be a hex head or the like to be driven by a socket driver. The fastener 20 is installed into the conductive body 30 from the interior side of the housing 34 so that the distal post end 22 extends out of the housing 34. In this embodiment, the intermediate region 26 is threaded into the conductor aperture 28. The fastener head 52 presses the busbar 36 against the contact surface 33 of the conductive body 30. The proximal post end 23 does not require an externally threaded region when the fastener head 52 is integral with the fastener 20. Likewise, an integral metal ring 32 is not required in this embodiment, because the fastener head 52 sets the depth limit of installation of the fastener 20 into the conductive body 30.

According to a first aspect, a fastener is provided with a pair of terminal ends with an intermediate region therebetween. At least one of the terminal ends is threaded. A sealant is at least partially disposed on the intermediate region.

According to a second aspect, the fastener of the first aspect is provided, wherein the other terminal end of the pair of terminal ends is threaded.

According to a third aspect, the fastener of the first aspect or the second aspect is provided, wherein the intermediate region is self-tapping.

According to a fourth aspect, the fastener of any of the first aspect to the third aspect is provided, wherein the sealant is composed of a synthetic polymer material.

According to a fifth aspect, the fastener of any of the first aspect to the fourth aspect is provided, wherein an external thread of the pair of terminal ends is oversized relative to the intermediate region to provide a limit to translation of the fastener into an aperture.

According to a sixth aspect, an assembly is provided with the fastener of any of the first aspect to the fifth aspect. A metal ring is disposed about the fastener that is oversized relative to the intermediate region to provide a limit to translation of the fastener into an aperture.

According to a seventh aspect, the fastener of any of the first aspect to the sixth aspect is further provided with a tool drive head on at least one of the terminal ends to receive a tool to drive the fastener.

According to an eighth aspect, an assembly is provided with a conductive body with an aperture formed therethrough sized to receive the intermediate region. The fastener of any of the first aspect to the fifth aspect and the seventh aspect is provided, wherein the intermediate region is threaded and installed in the aperture.

According to a ninth aspect, the assembly of the eighth aspect is provided, wherein the at least one terminal end is smaller than the intermediate region to fit through the conductive body aperture.

According to a tenth aspect, the assembly of the eighth aspect of the ninth aspect is provided, wherein the sealant seals an engagement of the intermediate region in the conductive body without an additional unitary seal.

According to an eleventh aspect, a method of installing the fastener of the eighth aspect to the tenth aspect into the conductive body is provided by rotating and translating the threaded intermediate region into the aperture of the conductive body.

According to a twelfth aspect, the method of the eleventh aspect is further provided by tapping threads into the aperture with the intermediate region.

According to a thirteenth aspect, an assembly is provided with a housing. The assembly of any of the eighth aspect to the tenth aspect is provided. The conductive body is installed through a wall of the housing such that one of the pair of terminal ends is oriented external of the housing, and the other of the pair of terminal ends is oriented internally within the housing.

According to a fourteenth aspect, the assembly of the thirteenth aspect is further provided with a busbar oriented in the housing and installed on the internal terminal end in electrical contact with the conductive body.

According to a fifteenth aspect, the assembly of the thirteenth aspect or the fourteenth aspect is further provided with a power transfer unit oriented within the housing in electrical communication with the conductive body.

According to a sixteenth aspect, the assembly of any of the thirteenth aspect to the fifteenth aspect is provided, wherein the housing is over-molded onto the conductive body.

According to a seventeenth aspect, an assembly is provided with a fastener with a pair of terminal ends and an intermediate region therebetween. At least one of the terminal ends is threaded. A sealant is at least partially disposed on the intermediate region. A conductive body with an aperture formed therethrough is sized to receive the intermediate region of the fastener.

According to an eighteenth aspect, the assembly of the seventeenth aspect is provided, wherein at least one terminal end is smaller than the intermediate region to fit through the conductive body aperture.

According to a nineteenth aspect, the assembly of the seventeenth aspect or the eighteenth aspect is provided, wherein the intermediate region is self-tapping.

According to a twentieth aspect, an assembly is provided with a housing. A conductive body is provided with an aperture formed therethrough. The conductive body is installed through a wall of the housing. A fastener is provided with a pair of terminal ends with an intermediate region therebetween. At least one of the terminal ends is threaded. The intermediate region is threaded and installed in the aperture, such that one of the pair of terminal ends is oriented external of the housing, and the other of the pair of terminal ends is oriented internally within the housing. A sealant is at least partially disposed on the intermediate region of the fastener to seal a threaded engagement between the intermediate region and the conductive body aperture. A power-transfer unit is oriented within the housing in electrical communication with the conductive body.

While various embodiments are described above, it is not intended that these embodiments describe all possible forms according to the disclosure. In that regard, the words used in the specification are words of description rather than limitation, and it is understood that various changes may be made without departing from the spirit and scope of the disclosure. Additionally, the features of various implementing embodiments may be combined to form further embodiments according to the disclosure.

What is claimed is:

1. A fastener, comprising:
   a pair of terminal ends with an intermediate region therebetween, wherein at least one terminal end of the pair of terminal ends is threaded;
   a sealant at least partially disposed on the intermediate region, and wherein at least a portion of threads associated with the intermediate region are configured to tap thread into an aperture of a conductive body that is overmolded into a housing of an electrical assembly such that the sealant breaks during the tap threading; and
   at least a portion of the intermediate region is configured to be sealed within the conductive body by the breakage of the sealant.

2. The fastener of claim 1, wherein other terminal end of the pair of terminal ends is threaded.

3. The fastener of claim 1, wherein the intermediate region is self-tapping.

4. The fastener of claim 1, wherein the sealant is composed of a synthetic polymer material.

5. The fastener of claim 1, wherein an external thread of the pair of terminal ends is oversized relative to the intermediate region to provide a limit to translation of the fastener into the aperture.

6. An assembly, comprising:
   the fastener of claim 1; and
   a metal ring disposed about the fastener that is oversized relative to the intermediate region to provide a limit to translation of the fastener into the aperture.

7. The fastener of claim 1, further comprising a tool drive head on the at least one terminal end of the pair of terminal ends to receive a tool to drive the fastener.

8. An assembly, comprising:
   the fastener of claim 1, wherein the intermediate region is threaded, and installed in the aperture, and wherein the aperture is configured to receive the intermediate region.

9. The assembly of claim 8, wherein the at least one terminal end is smaller than the intermediate region to fit through the aperture.

10. The assembly of claim 8, wherein the sealant seals an engagement of the intermediate region in the conductive body without an additional unitary seal.

11. A method of installing the fastener of claim 8 into the conductive body comprising rotating and translating the threaded intermediate region into the aperture of the conductive body.

12. An assembly, comprising:
    the assembly of claim 8, wherein one terminal end of the pair of terminal ends is oriented external of the housing, and other terminal end of the pair of terminal ends is oriented internally within the housing.

13. The assembly of claim 12, further comprising a busbar oriented in the housing and installed on the internal terminal end in electrical contact with the conductive body.

14. The assembly of claim 12, further comprising a power transfer unit oriented within the housing in electrical communication with the conductive body.

15. An assembly, comprising:
a fastener with a pair of terminal ends and an intermediate region therebetween, wherein at least one terminal end of the pair of terminal ends is threaded;
a sealant at least partially disposed on the intermediate region;
a conductive body with an aperture formed therethrough sized to receive the intermediate region of the fastener, and wherein at least a portion of threads associated with the intermediate region are configured to tap thread into the aperture of the conductive body that is overmolded into a housing of an electrical assembly such that the sealant breaks during the tap threading; and
at least a portion of the intermediate region is configured to be sealed within the conductive body by the breakage of the sealant.

16. The assembly of claim 15, wherein the at least one terminal end is smaller than the intermediate region to fit through the aperture of the conductive body, and wherein an internally threaded nut is installed on the at least one terminal end to secure a busbar into electrical contact with a contact surface of the conductive body.

17. The assembly of claim 15, wherein the intermediate region is self-tapping.

18. An assembly, comprising:
a housing;
a conductive body with an aperture formed therethrough, wherein the conductive body is overmolded into the housing;
a fastener with a pair of terminal ends with an intermediate region therebetween, wherein at least one terminal end of the pair of terminal ends is threaded, wherein the intermediate region is threaded and installed in the aperture, such that one terminal end of the pair of terminal ends is oriented external of the housing, and other terminal end of the pair of terminal ends is oriented internally within the housing;
a sealant at least partially disposed on the intermediate region of the fastener to seal a threaded engagement between the intermediate region and the aperture, and wherein at least a portion of threads associated with the intermediate region are configured to tap thread into the aperture such that the sealant breaks during the tap threading;
at least a portion of the intermediate region is configured to be sealed within the conductive body by the breakage of the sealant; and
a power-transfer unit oriented within the housing in electrical communication with the conductive body.

19. The assembly of claim 18, wherein the sealant comprises adhesive particles that break during the tap threading to provide a fluid-tight seal between the fastener and the conductive body, and wherein the conductive body comprises a plurality of external projections to lock the conductive body from rotation within a support.

20. The assembly of claim 18, wherein an internally threaded nut is installed on the at least one terminal end of the pair of terminal ends to secure a terminal plate in electrical contact with a contact surface on the conductive body.

* * * * *